United States Patent
Maehara et al.

(10) Patent No.: US 8,219,011 B2
(45) Date of Patent: *Jul. 10, 2012

(54) INTERMEDIATE TRANSFER MEMBER AND IMAGE FORMATION APPARATUS

(75) Inventors: Yuichiro Maehara, Tokyo (JP); Kenji Sakka, Tokyo (JP)

(73) Assignee: Konica Minolta Business Technologies, Inc. (JP)

( * ) Notice: Subject to any disclaimer, the term of this patent is extended or adjusted under 35 U.S.C. 154(b) by 316 days.

This patent is subject to a terminal disclaimer.

(21) Appl. No.: 12/527,963

(22) PCT Filed: Feb. 22, 2008

(86) PCT No.: PCT/JP2008/053045
§ 371 (c)(1),
(2), (4) Date: Aug. 20, 2009

(87) PCT Pub. No.: WO2008/105338
PCT Pub. Date: Sep. 4, 2008

(65) Prior Publication Data
US 2010/0098466 A1    Apr. 22, 2010

(30) Foreign Application Priority Data
Feb. 26, 2007   (JP) ................. 2007-045316

(51) Int. Cl.
*G03G 15/01* (2006.01)
*G03G 15/14* (2006.01)
*G03G 13/01* (2006.01)
*G03G 13/16* (2006.01)

(52) U.S. Cl. ... 399/308; 399/302; 430/47.4; 430/125.32

(58) Field of Classification Search ............ None
See application file for complete search history.

(56) References Cited

U.S. PATENT DOCUMENTS 5,950,058 A * 9/1999 Kusaba et al. ............ 399/302
(Continued)

FOREIGN PATENT DOCUMENTS
DE   102004017236 A1   10/2005
(Continued)

OTHER PUBLICATIONS

International Search Report for International Application No. PCT/JP2008/053045 mailed Mar. 25, 2008 with English Translation.

(Continued)

*Primary Examiner* — David Sample
*Assistant Examiner* — Nicole Gugliotta
(74) *Attorney, Agent, or Firm* — Cantor Colburn LLP (57) ABSTRACT

The invention provides an intermediate transfer member which is excellent in transferability and adhesion property and exhibits superior durability (releasability, resistance to lack of line images and cracking resistance) even after being used or aged under a severe environment over a long period of time and an image forming apparatus provided therewith. The intermediate transfer member comprises a substrate having thereon from the substrate side a first inorganic compound layer and a second inorganic compound layer, wherein a layer thickness ratio of the second inorganic compound layer to the first inorganic compound layer is not less than 1.0 and not more than 5.0, a carbon content of the first inorganic compound layer is not less than 0.5% by number of atoms and not more than 10% by number of atoms, and a carbon content of the second inorganic compound layer is less than 0.1% by number of atoms.

10 Claims, 4 Drawing Sheets

U.S. PATENT DOCUMENTS

| | | | | |
|---|---|---|---|---|
| 7,862,883 B2 * | 1/2011 | Kudo | | 428/195.1 |
| 2009/0123198 A1 * | 5/2009 | Kudo | | 399/308 |

FOREIGN PATENT DOCUMENTS

| | | |
|---|---|---|
| JP | 9-212004 A | 8/1997 |
| JP | 2000-206801 A | 7/2000 |
| JP | 2001-347593 A | 12/2001 |
| JP | 2005-290560 A | 10/2005 |
| JP | 2006-175633 A | 7/2006 |
| JP | 2006-233234 A | 9/2006 |
| JP | 2006-259581 A | 9/2006 |
| JP | 2007-17666 A | 1/2007 |
| WO | 2006/090602 A1 | 8/2006 |

OTHER PUBLICATIONS

Extended European Search Report for Application No./Patent No. 08711819.06-2209/2128717, dated Dec. 14, 2011.

* cited by examiner

INTERMEDIATE TRANSFER MEMBER AND IMAGE FORMATION APPARATUS

This is a U.S. national stage application of International Application No. PCT/JP2008/053045, filed on 22 Feb. 2008. Priority under 35 U.S.C. §119(a) and 35 U.S.C. §365(b) is claimed from Japanese Application No. JP2007-045316, filed 26 Feb. 2007, the disclosure of which is also incorporated herein by reference.

TECHNICAL FIELD

The present invention relates to an intermediate transfer member for synthesis of a toner image of an individual color for a color image and transfer thereof in an electrophotographic apparatus or an electrostatic image recording apparatus such as an electrophotographic copier, a laser beam printer, a facsimile and the like and an image formation apparatus provided with such an intermediate transfer member.

TECHNICAL BACKGROUND

As a system to transfer a toner image on an electrophotographic photoreceptor (hereinafter, also denoted simply as a photoreceptor) onto a recording material, there have been known an image forming system using an intermediate transfer member. In such system, one additional transfer step is introduced to the steps of transferring a toner image from an electrophotographic photoreceptor to a recording material, in which the toner image is transferred primarily from an electrophotographic photoreceptor to an intermediate transfer member and then, the primary transfer image on the intermediate transfer member is secondarily transferred to the recording material. This system has been often employed as a multiple transfer system in a so-called full-color image forming apparatus to reproduce a color-separated original image through subtractive color mixing by use of black, cyan, magenta and yellow toners.

However, a multiple transfer system employing such an intermediate transfer member, in which two separate transfers, a primary transfer and a secondary transfer are introduced and four color toner images are superimposed, often causes image defects accompanied with transfer troubles of the toner image.

In general, with regard to toner transfer troubles, there is known subjecting the toner surface to a surface treatment with an external additive such as silica, whereby enhanced transfer efficiency is achieved. However, such silica separates from the toner particle surface or is buried in the interior of the toner particle due to stress subjected from a stirring member in a developing device, stress subjected from a controlling blade to form a toner layer on a developing roller, stress subjected between a photoreceptor and a developing roller and the like, producing problems such that satisfactory transfer efficiency cannot be achieved.

To achieve enhanced secondary transfer efficiency of an intermediate transfer member, there was proposed a technique in which the surface of an intermediate transfer member is covered with a thin layer of an inorganic compound (for example, silicon oxide, aluminum oxide and the like), resulting in enhanced releasability of the toner image and achieving enhanced transfer efficiency onto recording paper or the like (as described in, for example, Patent documents 1 and 2).

Patent documents 1 and 2 describe that a layer of silicon oxide or aluminum oxide is formed on the surface of an intermediate transfer member to achieve enhanced releasability of toner particles from the intermediate transfer member. However, when an intermediate transfer member prepared in this method was subjected to an endurance test in a practical image forming apparatus, there was a problem that an oxide layer was stripped off from the surface layer upon repeated bending action and there was also a problem that a large-scaled facility such as a vacuum equipment was required to form a silicon oxide or aluminum oxide layer through vacuum deposition or spattering.

In light of the foregoing problems, methods for enhancing secondary transferability of an intermediate transfer member include a technique of forming a thin layer of an inorganic compound (such as silicon oxide or aluminum oxide) through an atmospheric plasma treatment process. When forming a thin an inorganic compound layer in this method, there may be employed a constitution comprised of a first layer (adhesive layer) and a second layer (surface layer or hard layer) to achieve superior durability (for example, adhesion of a thin-layer to a substrate or hardness of a surface thin-layer). In such layer constitution, to incorporate a stress relaxation function to the first layer, the reaction condition of an auxiliary gas (for example, nitrogen gas, hydrogen gas and the like) is controlled so that thin layer formation is not completed with the raw material, whereby the carbon content within the formed thin-layer is controlled to remain constant.

There was also proposed a method of forming an inorganic coating layer on the surface of an intermediate transfer member (as described in, for example, patent document 3). In the method proposed in the patent document 3, it was proved that an increased amount of colloidal silica added to an inorganic coating layer resulted in enhanced releasability of the toner, leading to improved transfer efficiency, however, repeated bending action in a durability test caused cracking of the inorganic coating layer, rendering addition of more colloidal silica than a given amount to be infeasible. Accordingly, there were problems that sufficient releasability was not achieved and a transfer efficiency was not enhanced more than a given level.

Patent document 1: Japanese Patent Application Publication JP 9-212004A,
Patent document 2: JP 2001-347593A
Patent document 3: JP 2000-206801

DISCLOSURE OF THE INVENTION

Problem to be Solved in the Invention

In view of the foregoing problems, the present invention has come into being and it is an object of the present invention to provide an intermediate transfer member which is excellent in transferability and adhesion property and exhibits superior durability (releasability, resistance to lack of line images and cracking resistance) even after being used or aged under a severe environment over a long period of time, and an image forming apparatus provided therewith.

Means for Solving the Problem

The foregoing object of the present invention is achieved by the following constitution.

1. An intermediate transfer member comprising a substrate having thereon from the substrate side a first inorganic compound layer and a second inorganic compound layer, wherein a layer thickness ratio of the second inorganic compound layer to the first inorganic compound layer is not less than 1.0 and not more than 5.0, thea carbon content of the first inorganic compound layer is not less than 0.5% by number of atoms and not more than 10% by number of atoms, and the carbon content of the second inorganic compound layer is less than 0.1% by number of atoms.

2. The intermediate transfer member, as described in the foregoing 1, wherein the first inorganic compound layer exhibits a thickness of not less than 20 nm and not more than 200 nm.

3. The intermediate transfer member, as described in the foregoing 1 or 2, wherein the second inorganic compound layer exhibits a thickness of not less than 100 nm and not more than 500 nm.

4. The intermediate transfer member, as described in any of the foregoing 1 to 3, wherein the layer thickness ratio of the second inorganic compound layer to the first inorganic compound layer is not less than 1.5 and not more than 2.5.

5. The intermediate transfer member, as described in any of the foregoing 1 to 4, wherein the first inorganic compound layer or the second inorganic compound layer comprises an inorganic compound containing at least one atom selected from the group consisting of Si, Ti, Al, Zr and Zn.

6. The intermediate transfer member, as described in any of the foregoing 1 to 4, wherein the first inorganic compound layer and the second inorganic compound layer comprise an inorganic compound containing at least one atom selected from the group consisting of Si, Ti, Al, Zr and Zn.

7. The intermediate transfer member, as described in any of the foregoing 1 to 6, wherein the first inorganic compound layer and the second inorganic compound layer are each comprised of an inorganic compound of a silicon oxide, and the first inorganic compound layer exhibits an average layer density of not less than 1.80 g/cm$^3$ and less than 2.15 g/cm$^3$, and the second inorganic compound layer exhibits an average layer density of not less than 2.10 g/cm$^3$ and less than 2.30 g/cm$^3$.

8. The intermediate transfer member, as described in any of the foregoing 1 to 7, wherein the first inorganic compound layer or the second inorganic compound layer is formed by an atmospheric pressure plasma CVD method, which comprises supplying a gas containing a layer forming gas to an electric discharge space formed between opposed electrodes under atmospheric pressure or a pressure near atmospheric pressure, applying a high-frequency electric field to the electric discharge space to excite the gas and exposing the substrate to the excited gas to form an inorganic compound layer on the substrate.

9. The intermediate transfer member described in any of the foregoing 1 to 7, wherein the first inorganic compound layer and the second inorganic compound layer are formed by an atmospheric pressure plasma CVD method, which comprises supplying a gas containing a layer forming gas to an electric discharge space formed between opposed electrodes under atmospheric pressure or a pressure near atmospheric pressure, applying a high-frequency electric field to the electric discharge space to excite the gas and exposing the substrate to the excited gas to form an inorganic compound layer on the substrate.

10. An image forming apparatus of developing an image carrier surface to form a toner image, transferring the toner image to an intermediate transfer member and further transferring the toner image to a transfer paper, wherein the intermediate transfer member is one described in any of the foregoing 1 to 9.

Effect of the Invention

The present invention provided an intermediate transfer member which is superior in transferability and close contact property and exhibits superior durability (releasability, resistance to lack of line images and cracking resistance) even after being used or aged under a severe environment over a long period of time, and an image forming apparatus provided therewith.

| DESCRIPTION OF DESIGNATIONS | |
|---|---|
| 1: | Color image forming apparatus |
| 2: | Production apparatus for intermediate transfer member |
| 3: | Atmospheric plasma CVD apparatus |
| 4: | Atmospheric plasma apparatus |
| 17: | Intermediate transfer member unit |
| 20: | Roll electrode |
| 21: | Fixed electrode |
| 23: | Electric discharge space |
| 24: | Mixed gas supplying device |
| 25: | First power source |
| 26: | Second power source |
| 41: | Thin layer forming area |
| 117: | Secondary transfer roller |
| 170: | Intermediate transfer belt |
| 175: | Substrate |
| 176: | First inorganic compound layer |
| 177: | Second inorganic compound layer |
| 201: | Driven roller |

PREFERRED EMBODIMENT OF THE INVENTION

In the following, there will be detailed preferred embodiments of the present invention.

As a result of extensive study by the inventors in view of the afore-mentioned problems, an intermediate transfer member which is superior in transferability and close contact property and exhibits superior durability (releasability, resistance to lack of line images and cracking resistance) even after being used or aged under a severe environment over a long period of time was realized by an intermediate transfer member comprising on a substrate from the substrate side a first inorganic compound layer and a second inorganic compound layer, featured in that a layer thickness ratio of the second inorganic compound layer to the first inorganic compound layer (thickness of second inorganic compound layer/thickness of first inorganic compound layer) is not less than 1.0 and not more than 5.0, a carbon content of the first inorganic compound layer is not less than 0.5% by number of atoms (or at. %) and not more than 10 at. %, and a carbon content of the second inorganic compound layer is less than 0.1 at. %.

Thus, the intermediate transfer member comprises, on a substrate, a first inorganic compound layer (adhesive layer, stress relaxation layer) having a high carbon content and a low density, and a second inorganic compound layer (surface layer, a cured film layer) having a low carbon content and a high density at a prescribed layer thickness ratio, in which a low molecular weight by-products (mainly comprised of a siloxane compound and exhibiting a high surface energy-lowering capability) remained in the first layer when forming the layer (mainly comprised of a siloxane compound and exhibiting a high surface energy-lowering capability) diffuse to the second layer (being a surface layer in many case), causing bleed-out and preventing lowering of surface energy, whereby superior transferability, surface hardness and cracking resistance are maintained and troubles of lack of line images, due to lowering of surface energy are also inhibited.

There will be further detailed the intermediate transfer member of the invention.

The intermediate transfer member of the invention is suitably used for image forming apparatuses such as an electrophotographic copier, a printer and a facsimile equipment and may be any one onto which surface a toner image held on the photoreceptor surface is primarily transferred and which holds the transferred toner image and transfers the held toner image to a material subject to being transferred, such as a sheet of recording paper, including, for example, a belt-form transfer member and a drum-form transfer member.

First, constitution of an image forming apparatus installed with an intermediate transfer member of the invention will be described with reference to an example of a tandem type full-color copier.

Figure 1:
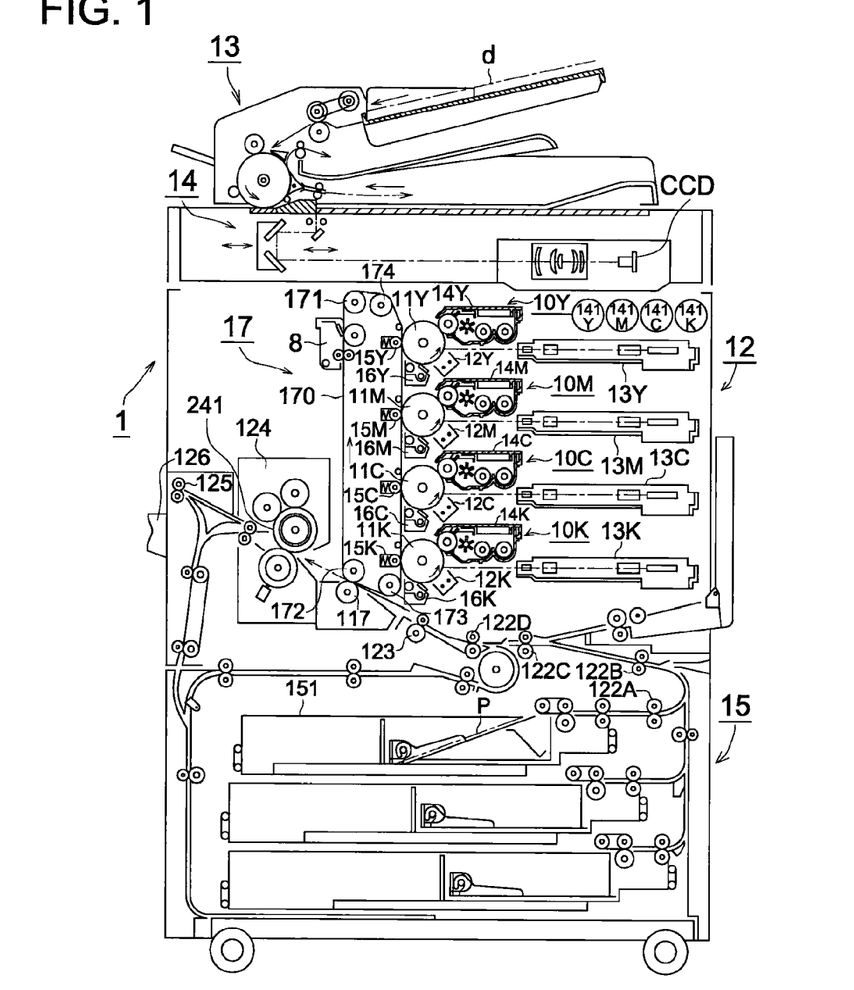
FIG. 1 is a sectional view illustrating an example of constitution of a color image forming apparatus.

FIG. 1 is a sectional view showing an example of constitution of a color image forming apparatus.

This color image forming apparatus 1 is called a tandem type full-color copier, which is comprised mainly of an automatic document feeder 13, an original image reader 14, plural exposure means 13Y, 13M, 13C and 13K, plural sets of image forming sections 10Y, 10M, 10C and 10K, an intermediate transfer member 15, a paper feeder 15 and a fixing means 124.

On the upper portion of a main body 12 of the color image forming apparatus 1 are disposed the automatic document feeder 13 and the original image reader 14. An image of a document (d) conveyed by the automatic document feeder 13 is reflected and image-formed through an optical system of the original image reader 14 and read by a line image sensor CCD.

Analog signals to which an original image read by the line image sensor CCC has been photoelectric-converted, are subjected to an analog treatment, an A/D conversion, shading correction and an image compression treatment in an image processing section (not shown in the drawing), and then transmitted to exposure means 13Y, 13M, 13C and 13K as digital data for the respective colors and latent images of the respective color image data are formed on each of drum-form photoreceptors 11Y, 11M, 11C and 11K as a first image carrier via exposure means 13Y, 13M, 13C and 13K.

The image forming sections 10Y, 10M, 10C and 10K are tandemly disposed in the vertical direction and an intermediate transfer member 170 of the invention, as a semi-conductive, endless belt-formed, second image carrier is disposed to the left side of photoreceptors 11Y, 11M, 11C and 11K, while being rotatably entrained about rollers 171, 172, 173 and 174. The intermediate transfer member 170 is driven in the direction indicated by the arrow through the roller 171 by a driving device (not shown in the drawing).

The yellow image forming section 10Y is provided with an electric-charging means 12Y, an exposure means 13Y, a developing means 14Y, a primary transfer roller 15Y as a primary transfer means and a cleaning means 16Y which are disposed around the photoreceptor 11Y.

The magenta image forming section 10M is provided with the photoreceptor 11M, an electric-charging means 12M, an exposure means 13M, a developing means 14M, a primary transfer roller 15M as a primary transfer means and a cleaning means 16M.

The cyan image forming section 10C is provided with the photoreceptor 11C, an electric-charging means 12C, an exposure means 13C, a developing means 14C, a primary transfer roller 15C as a primary transfer means and a cleaning means 16C.

The black image forming section 10K is provided with the photoreceptor 11K, an electric-charging means 12K, an exposure means 13K, a developing means 14K, a primary transfer roller 15K as a primary transfer means and a cleaning means 16K.

Toner supplying means 141Y, 141M, 141C and 141K supply toners to the developing means 14Y, 14M, 14C and 14K, respectively.

Primary transfer rollers 15Y, 15M, 15C and 15K each selectively operate according to the type of image by a control means not shown in the drawing and the intermediate transfer member 170 is compressed onto the respective photoreceptors 11Y, 11M, 11C and 11K to transfer an image onto the photoreceptor.

Thus, the respective color images formed on the photoreceptors 11Y, 11M, 11C and 11K in the image forming sections 10Y, 10M, 10C and 10K are sequentially transferred to the rotating intermediate transfer member 170 to form a combined color image.

Namely, a toner image held on the photoreceptor surface is primarily transferred onto the surface of an intermediate transfer member to hold the transferred toner image.

Recording paper P, as a recording medium which is contained within a paper feeding cassette 151, is fed by a paper feeding means and conveyed to a secondary transfer roller 117 as a secondary transfer means via plural intermediate rollers 122A, 122B, 122C, 122D and a resist roller 123. Then, a toner image which has been synthesized on an intermediate transfer member by the secondary transfer roller 117 is transferred together onto the recording paper P. Thus, the toner image held on the intermediate transfer member is secondarily transferred onto the surface of a material to be subjected to transfer.

A secondary transfer means 6 causes the recording paper P to be compressed to the intermediate transfer member 170 only when the recording paper P passes here and is subjected to secondary transfer.

The recording paper P onto which a color image is transferred is subjected to fixing by a fixing device 124, sandwiched between delivery rollers 125 to be eject onto a delivery tray 126 disposed outside the machine.

Meanwhile, after having transferred the color image onto the recording paper P by the secondary transfer roller 117, the intermediate transfer member 170 which has separated the recording paper P through self stripping is subjected to cleaning to remove a residual toner by a cleaning means 8.

Herein, the intermediate transfer member may be replaced by an intermediate transfer drum of a rotatable drum-form.

In the following, there will be described primary transfer rollers 15Y, 15M, 15C and 15K as a primary transfer means in contact with the intermediate transfer member 170, and the constitution of the intermediate transfer member 170.

The primary transfer rollers 15Y, 15M, 15C and 15K, or a secondary transfer roller 6 is formed by covering the circumferential surface of an electrically conductive core bar, e.g., stainless steel of 8 mm outer diameter with a 5 m thick semi-conductive elastic rubber exhibiting a rubber hardness of ca. 20-70° (Asker hardness C) and a volume resistance of ca. $1\times10^5$-$1\times10^9 \Omega \cdot cm$ in the form of a solid or a foamed sponge in which a conductive filler such as carbon is dispersed or an ionic conductive material is contained.

The secondary transfer roller 6, differing from the primary transfer rollers 15Y, 15M, 15C and 15K, can be in contact with a toner when the recording paper P is not present, so that the surface of the secondary transfer roller 6 is preferably covered with an electrically semi-conductive fluorinated resin or an easily releasable urethane resin. The circumference of the conductive core bar of stainless steel or the like is covered with a 0.05-0.5 mm thick, electrically semi-conductive material in which an electrically conductive filler such as carbon is dispersed or an conductive ionic material is contained in a rubber or a resin material such as polyurethane, EPDM, silicone or the like.

In the following, there will be described the layer constitution of the intermediate transfer member of the present invention, with reference to the foregoing intermediate transfer member 170.

Figure 2:
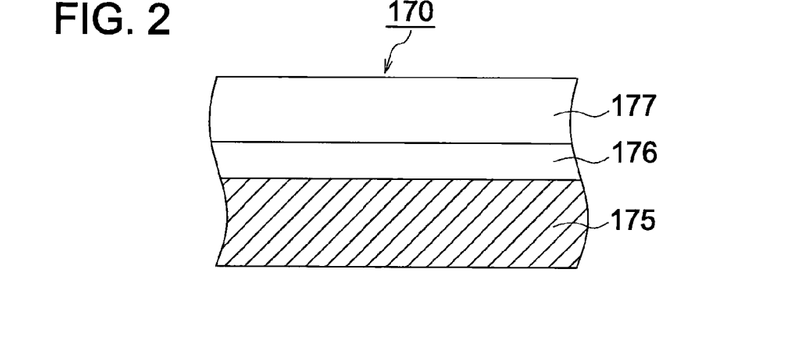
FIG. 2 is a sectional view illustrating an example of layer constitution of an intermediate transfer member of the invention.

FIG. 2 is a sectional view showing an example of a layer arrangement of the intermediate transfer member of the invention.

The intermediate transfer member 170 of the invention comprises, on the surface of a substrate 175, a first inorganic compound layer 176 and a second inorganic compound layer 177 in the sequence from the substrate 175; the layer thickness ratio of the first inorganic compound layer 176 to the second inorganic compound layer 177 (that is 176:177) is in the range of from 1.0:1.0 to 1.0:5.0; the first inorganic compound layer 176 is a layer of a high carbon content and a low density, having a carbon content of not less than 0.5% by number of atoms and not more than 10% by number of atoms and an average layer density of not less than 1.80 g/cm² and not more than 2.15 g/cm²; and the second inorganic compound layer 177 is a layer of a low carbon content and a high density, having a carbon content of less than 0.1% by number of atoms and an average layer density of not less than 2.10 g/cm² and not more than 2.30 g/cm².

The foregoing constitution makes it feasible to achieve the intermediate transfer member 170 exhibiting superior releasability from a toner and enhanced transfer efficiency, and inhibiting bleed-out of low molecular weight by-products onto the surface even after repeated use while maintaining superior transfer performance over a long period of time.

In the intermediate transfer member of the invention, one feature is that the carbon content of the first inorganic compound layer is not less than 0.5% by number of atoms and not more than 10% by number of and that of the second inorganic compound layer is less than 0.1% by number of atoms.

In the first inorganic compound layer (adhesive layer) of the invention, a carbon content of less than 0.5% by number of atoms results in a lowering of adhesion of the layer onto the substrate, tending to be easily peeled, and a carbon content of more than 10% by number of atoms allows easy migration of low molecular weight by-products within the first inorganic compound layer, leading to lowered stability when is aged over a long period of time.

The second inorganic compound layer of the invention preferably has a carbon content of less than 0.1% by number of atoms, and more preferably having no carbon atom. A carbon content of not less than 0.1% by number of atoms of the second inorganic compound layer results in deteriorated durability due to lowering of thin-layer strength and lowered capability inhibiting bleed-out of low molecular weight by-products onto the surface, resulting in a lowering of effects inhibiting diffusion of low molecular weight by-products from the first inorganic compound layer positioned in the lower layer.

The atomic percent or percent by number of atoms representing the carbon content, as referred to in the invention, which is determined in the following XPS method, is defined below:

% by number of atoms (atomic concentration)=[(the number of carbon atoms)/(the total number of atoms)]×100

In the present invention, there was used a surface analyzer, ESCALAB-200R, produced by VG Scientific Co. Specifically, measurement was conducted using Mg for an X-ray anode at an output of 600 W (accelerating voltage: 15 kV, emission current: 40 mA). Energy resolving power was set at 1.5 eV to 1.7 eV when defined in a half width of a clean Ag3d5/2 peak.

First, measurement was performed at data incorporating intervals of 0.2 eV in a bonding energy range of 0 eV to 1100 eV to determine the elements to be detected.

Then, with respect to all the detected elements except for etching species, narrow scanning for a photoelectron peak giving a maximum intensity was performed at data incorporating intervals of 0.2 eV to determine spectra of the respective elements.

To inhibit occurrence of difference in determined content result, caused by the differences of measurement instruments or computers, the obtained spectrum was transferred to COMMON DATA PROCESSING SYSTEM, produced by VAMAS-SCA-JAPAN Co. (preferably after Ver. 2.3) and processed by the same software to determine the contents of the respective targeted elements (carbon, oxygen, silicon. titanium and the like) in terms of percent by number of atoms (atomic concentration or at. %).

Prior to quantitative analysis, calibration of the Count Scale was conducted to perform a smoothing treatment of 5 points. In the quantitative analysis was used a peak area intensity (cps*eV). This background treatment employed the Shirley method. The Shirley method is referred to D. A. Shirley, Phys. Rev., B5, 4709 (1972).

In the intermediate transfer member of the invention, inorganic compounds constituting the first inorganic compound and the second inorganic compound are each a silicon oxide. The average layer density of the first inorganic compound layer is not less than 1.80 g/cm³ and less than 2.15 g/cm³, while the average layer density of the second inorganic compound layer is not less than 2.10 g/cm³ and not more than 2.30 g/cm³.

An average layer density of the second inorganic compound layer of less than 2.10/cm³ results in a lowering of barrier function, leading to reduced effect of inhibiting diffusion of low molecular weight by-products from the first inorganic compound layer.

The layer density of the individual inorganic compound layer, as defined in the invention can be determined by commonly known analytical means but a value determined in an X-ray reflectance method is used in the present invention. Such an X-ray reflectance method can be conducted with reference to, for example, "X-ray Diffraction Handbook" p. 151 (edited by Rigaku Denki Co., Ltd., 2000, Kokusai Bunken Insatsu Corp.) or Kagaku Kogyo, January 1999, No. 22.

A specific example of a measurement method useful in the invention will be described below.

Measurement is conducted using a measurement apparatus, MXP 21, produced by Mac Science Corp. Copper as an X-ray target is used and actuated at 42 kV and 500 mA. There is used a multi-layer parabola mirror as an incident monochrometer. There are also used an incident slit of 0.05×5 mm and light-receiving slit of 0.03×20 mm. Measurement is conducted by a FT method at a step width of 0.005° and 10 sec. for one step from 0 to 5° in a 2θ/θ scanning system. The obtained reflectance curve is subjected to curve-fitting by using Reflectivity Analysis Program Ver. 1, produced by Mac Science Corp. to determine the respective parameters so that the residual square sum between a measurement value and a fitting curve is minimum. The thickness and the average layer density of the respective layers are determined from the respective parameters.

As described above, the intermediate transfer member of the invention is featured in that a carbon content of the first inorganic compound layer not less than 0.5 atomic % and not more than 10 atomic %, or the average layer density of the first inorganic compound layer is not less than 1.80 g/cm$^3$ and less than 2.15 g/cm$^3$, while the average layer density of the second inorganic compound layer is not less than 2.10 g/cm$^3$ and not more than 2.30 g/cm$^3$. The first layer or the second layer of the invention may optionally have a multilayer structure comprised of two or more layers. For example, there is cited a constitution, in which the first layer is comprised of two layer where a first layer (A) of the substrate side has a carbon content of 9.5 atomic % and a first layer (B) in contact with the second layer has a carbon content of 0.7 atomic %. Further, the second layer is comprised of two layers, a second layer (A) in contact with the first layer has a layer density of 2.15 g/cm$^3$ and a second layer (B) of the surface side has a layer density of 2.20 g/cm$^3$. Such a multilayer structure in which the first layer or the second layer comprising two or more layers results in enhanced film-forming speed at the time of thin-film formation, leading to formation of a high quality thin-film.

The intermediate transfer member of the invention may be constituted so that an intermediate layer is provided between the first layer and the second layer. For example, providing an intermediate layer having a carbon content of 0.3 atomic % between the first layer and the second layer can relax a discontinuous and abrupt change in physical layer property between the first layer and the second layer. Further, in the invention, the foregoing multi-layer arrangement does not vitiate the object or effects of the invention.

In the intermediate transfer member of the invention, the layer thickness ratio of the second inorganic compound layer to the first inorganic compound layer [(layer thickness of second inorganic compound layer)/[(layer thickness of first inorganic compound layer)] is preferably not less than 1.0 and not more than 5.0, and more preferably not less than 1.5 and not more than 2.5.

When a layer thickness ratio of the second inorganic compound layer to the first inorganic compound layer is less than 1.0, or when the first inorganic compound layer is thicker than the second inorganic compound layer, the content of unreacted raw materials in the first inorganic compound layer is increased and the second inorganic compound layer becomes thinner, resulting in reduced effect of inhibiting bleed-out. On the other hand, when the layer thickness ratio of the second inorganic compound layer to the first inorganic compound layer is more than 5.0, or when the first inorganic compound layer is thinner than the second inorganic compound layer, a function of stress relaxation of the first inorganic compound layer is lowered, tending to cause a lowering of adhesion to the substrate or troubles such as cracking.

The thickness of the first inorganic compound layer is preferably not less than 20 nm and not more than 200 nm. The thickness of the second inorganic compound layer is preferably not less than 100 nm and not more than 500 nm to achieve the object and effect of the invention.

In the following, there will be described the individual constituent element of the intermediate transfer member of the invention.

Substrate

The substrate applicable to the intermediate transfer member preferably is a belt formed of a dispersion of an electrically conductive agent in a resin material. Resins used for such a belt are not specifically limited, and there are usable so-called engineering plastic materials, such as polycarbonate, polyimide, polyether ether ketone, poly(fluorovinilidene), ethylene tetrafluoroethylene copolymer, polyamide and polyphenylene sulfide. Further, carbon black is usable as an electrically conductive agent. Carbon black is not specifically limited and a neutral carbon black may be used. An electrically conductive agent is added, depending on its kind, in such an amount that volume and surface resistance values of the intermediate transfer member fall within the prescribed range, which is usually in an amount of 4-40 parts by mass per 100 parts by mass of resin material. The substrate used in the invention can be manufactured by a conventional method known in the art. For example, manufacturing is conducted by fusing a resin material in an extruder and extruding it through a circular die or a T-die, followed by being rapidly cooled.

First Inorganic Compound and Second Inorganic Compound

Subsequently, a first inorganic compound layer and a second inorganic compound layer relating to the invention are formed on the substrate described above.

Inorganic compounds used for the first inorganic compound layer and the second inorganic compound layer include inorganic oxides, inorganic nitrides, inorganic carbides and their composite materials.

Examples of inorganic oxides used for formation of the first inorganic compound layer and the second inorganic compound layer of the invention include silicon oxide, aluminum oxide, tantalum oxide, titanium oxide, zirconium oxide, tin oxide, zinc oxide, iron oxide, beryllium oxide, barium strontium titanate, barium zirconate titanate, lead lanthanum titanate, strontium titanate, barium titanate, bismuth titanate, strontium bismuth titanate, strontium bismuth tantalate, bismuth tantalate niobate and yttrium trioxide.

In the present invention, at least one layer selected from the first inorganic compound layer and the second inorganic compound layer is composed preferably of an inorganic compound containing at least one atom selected from Si, Ti, Al, Zr and Zn, and more preferably, all of the first inorganic compound layer and the second inorganic compound layer are composed of an inorganic compound containing at least one atom selected from Si, Ti, Al, Zr and Zn. Accordingly, an inorganic compound constituting the individual layer preferably is silicon oxide, aluminum oxide, titanium oxide, zinc oxide or zirconium oxide. Specifically preferably, an inorganic compound constituting each of the first inorganic compound layer and the second inorganic compound layer is silicon oxide.

Further, the first inorganic compound layer and the second inorganic compound layer relating to the invention, each may be comprised of a single kind of an inorganic compound or plural kinds of inorganic compounds.

In the present invention, before forming the first inorganic compound layer on the substrate, the surface of the substrate may be subjected to a surface treatment such as a corona discharge treatment, a flame treatment, a plasma treatment, a glow discharge treatment, a surface-roughing treatment or a chemical treatment.

Next, there will be described a method of forming the first inorganic compound and the second inorganic compound relating to the invention.

In the intermediate transfer member of the invention, the method of forming the first inorganic compound and the second inorganic compound relating to the invention is not specifically limited and examples thereof include a dry process such as a vacuum deposition method, a molecular beam epitaxial growth method, an ion cluster beam method, anion plating method, a CVD method, a sputtering method and an atmospheric plasma CVD method; a coating method such as a spray coat method, a spin coat method, a blade coat method, a dip coat method, a cast method, a roll coat method, a bar coat method, and a die coat method; and a wet process such as a method by patterning, e.g., printing or ink-jet, which are usable according to materials. The wet process employs a method in which a solution of inorganic compound particles are dispersed in an organic solvent or water optionally by using an auxiliary dispersing agent such as a surfactant, coated and dried, and a so-called sol-gel method in which a solution of an oxide precursor such as alkoxide body is coated and dried.

In the intermediate transfer member of the invention, specifically, the first inorganic compound layer or the second inorganic compound layer is formed preferably by an atmospheric plasma CVD method in which a gas containing a thin-layer forming gas is supplied to a discharge space formed between opposed electrodes and a high-frequency electric field is applied to the discharge space to excite the gas and the substrate is exposed to the thus excited gas to form an inorganic compound thin-layer on the substrate. More preferably, the first inorganic compound layer and the second inorganic compound layer are formed by the foregoing atmospheric plasma CVD method to achieve the afore-mentioned object and effect of the invention.

This atmospheric plasma CVD method, which does not require a reduced pressure chamber or the like and can perform high-speed film formation, is a film forming method of enhanced productivity.

There will be specifically described below a method of forming a first inorganic compound layer and a second inorganic compound layer (e.g., inorganic compound: $SiO_2$, $TiO_2$) through an atmospheric plasma CVD method.

The atmospheric plasma CVD method (hereinafter, also denoted as an atmospheric plasma method) refers to a treatment in which a discharge gas is excited and discharged under atmospheric pressure or a pressure near atmospheric pressure and a raw material gas or a reaction gas is introduced to a discharge space and excited, thereby forming a thin-layer on the substrate. Such a method is described in JP 11-133205A, JP 2000-185362, JP 11-61406, JP2000-147209 and JP 2000-121804. The atmospheric plasma method can form a highly functional thin-layer at excellent productivity. Herein, an atmospheric pressure or a pressure near an atmospheric pressure refers to a pressure of from 20 kPa to 110 kPa, and preferably from 93 kPa to 104 kPa.

In the following, there will be described an apparatus, a method and various kinds of gases used therein when forming the individual inorganic compound layer of the intermediate transfer member relating to the invention through the atmospheric pressure plasma CVD method.

Figure 3:
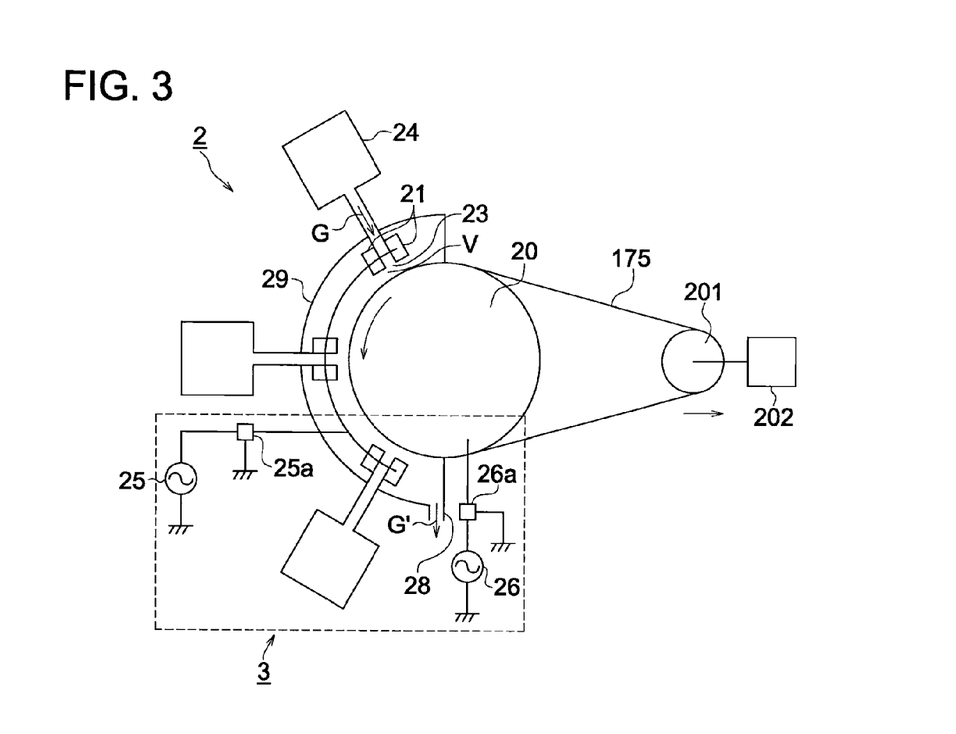
FIG. 3 is a schematic view illustrating an example of an atmospheric plasma treatment apparatus applicable to production of an intermediate transfer member.

FIG. 3 is a schematic view showing an example of an atmospheric plasma treatment apparatus applicable to production of the intermediate transfer member.

In FIG. 3, a producing apparatus 2 of an intermediate transfer member (a direct system in which the discharge space is almost the same as the thin-layer deposition area) is one which forms a first inorganic compound layer and a second inorganic compound layer on a substrate 175 and is comprised of a roll electrode 20 and driving roller 201 entraining an endless-form intermediate transfer member and rotating in the direction indicated by the arrow, and an atmospheric plasma CVD apparatus 3 as a thin-layer forming apparatus to form a first inorganic compound layer and a second inorganic compound layer.

The atmospheric plasma CVD apparatus 3 is provided with at least one set of fixed electrodes 21 disposed along the circumference of the roll electrode 20, a discharge space 23 in which the fixed electrodes 21 opposes the roll electrode 20 and discharging is performed, a mixed gas supplying device 24 to form a mixed gas G of raw material gas and discharge gas and supply the mixed gas G to a discharge space 23, a discharge vessel 29 to reduce inflow of air into the discharge space 23, a first power source 26 connected to the roll electrode 20, a second power source connected to the fixed electrode 21, and an exhaust section 28 to exhaust an exhaust gas G'.

The mixed gas supplying device 24 (which is represented by three stations in FIG. 3) supplies a raw material gas to form each of the first inorganic compound layer and the second inorganic compound layer, nitrogen gas or a rare gas such as argon gas or helium gas and a gas to inhibit decomposition of the raw material gas to the discharge space 23.

Herein the gas to control decomposition of a raw material gas (also called raw material decomposition control gas) represents a gas containing an active element in the molecular structure, and including gases containing, for example, H, O, N, S, F, B, Cl, P, Br, I, As or Se. Such a gas containing an active element may be used singly or in the form of a mixture of plural gases. A gas containing C in the molecular structure of a gas containing an active element may be used or a gas containing C in its molecular structure and may also be mixed in terms of control of the carbon content of the formed thin-layer.

The driving roller 201 is energized by a tension-energizing means 202 in the direction indicated by the arrow and applies a prescribed tension to a substrate 175. The tension-energizing means 202 releases application of tension when replacing the substrate 175, rendering easy replacement of the substrate 175.

A first power source 26 outputs a voltage of frequency ω1 and a second power source 25 outputs a voltage of frequency ω2 and these voltages generate electric field V formed by overlapping frequencies ω1 and ω2 in the discharge space 23. The discharge gas is energized to form a plasma state by the electric field V and a thin-layer corresponding to a raw material gas contained in the mixed gas G (for example, in the case of FIG. 2, correspond to the first inorganic compound layer 176 and the second inorganic compound layer 177) is deposited on the surface of the substrate 175.

Alternatively, inorganic compound layers may be stacked by plural fixed electrodes located downstream in the rotational direction of a roll electrode and a mixed gas supplying device, whereby the inorganic compound layer thickness is controlled.

In the layer constitution shown in FIG. 2, for example, the first inorganic compound layer 176 is formed by a fixed electrode located most downstream in the rotational direction of the electrode among plural fixed electrodes and a mixed gas supplying device, while the second inorganic compound layer 177 is formed by a second fixed electrode located upstream and another mixed gas supplying device. The thus continuous thin-layer formation results in enhanced productivity and also can achieve improved adhesion of the first inorganic compound layer to the second inorganic compound layer and produce an intermediate transfer member of enhanced durability.

Further, to achieve enhanced adhesion of the first inorganic compound layer 176 to the substrate 175, a gas supplying device to supply a gases such as nitrogen, helium, argon, oxygen or hydrogen and a fixed electrode may be provided upstream from a fixed electrode and a mixed gas supplying device to form the first inorganic compound layer to perform plasma treatment, thereby activating the surface of the substrate 175.

Further, in another embodiment, one electrode of a roll electrode and a fixed electrode is grounded and the other electrode is connected to a power source. In such a case, the power source preferably employs a second power source in terms of formation of a denser layer, specifically when using a rare gas such as argon as the discharge gas.

Figure 4:
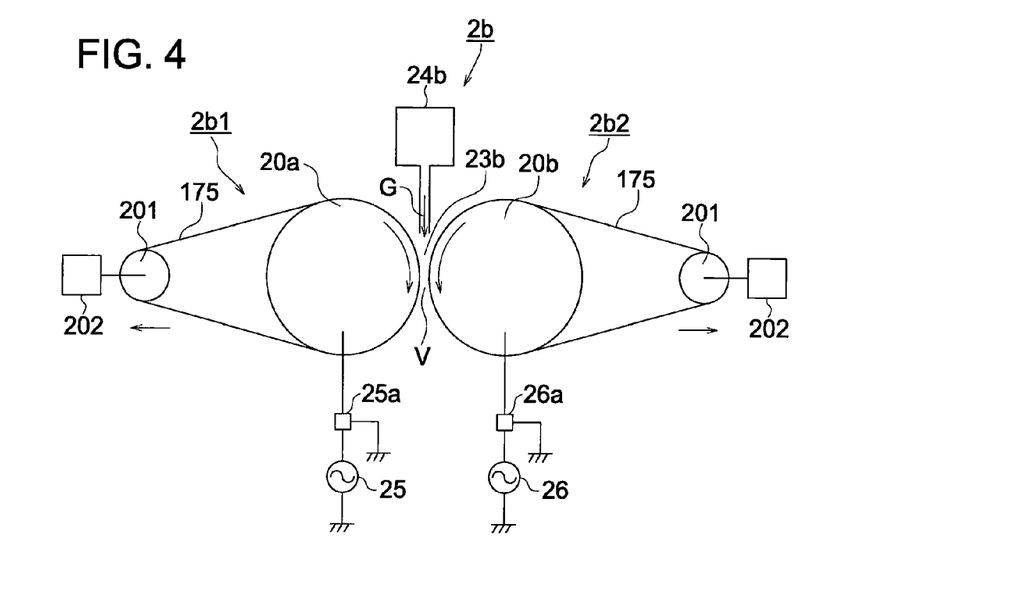
FIG. 4 is a schematic view illustration another example of an atmospheric plasma treatment apparatus applicable to production of an intermediate transfer member.

FIG. 4 is a schematic view showing another example of an atmospheric plasma treatment apparatus applicable to production of an intermediate transfer member.

A second production apparatus 2b of an intermediate transfer member simultaneously forms a first inorganic compound layer and a second inorganic compound layer, respectively, on plural (two in FIG. 4) substrates, and is mainly constituted of film forming devices 2b1 and 2b2 to form an inorganic compound layer on the substrate surface.

The second production apparatus 2b (which is a deformed direct system and performs discharging and thin-layer deposition between opposed roll electrodes) is provided with a first film forming device 2b1 and a second film forming device 2b1 which are separated at a prescribed distance, and a mixed gas supplying device 24b which is disposed between the first film forming device 2b1 and the second film forming device 2b2, forms a gas mixture G of at least a raw material gas and a discharge gas and supplies the gas mixture to a discharge space 23B.

The first film forming device 2b1 is provided with a roll electrode 20a entraining an endless form substrate 175 of an intermediate transfer member and rotating in the direction indicated by an arrow, a driving roller 201, a tension-energizing means 202 to energize the driving roller 201 and a first power source 25 connected to the roll electrode 20a; the second film forming device 2b2 is provided with a roll electrode 20b entraining an endless form substrate 175 of an intermediate transfer member and rotating in the direction indicated by the arrow, a driving roller 201, a tension-energizing means 202 to energize the driving roller 201 and a second power source 26 connected to the roll electrode 20b.

Further, the second production apparatus 2b is provided with a discharge space 23b in which discharging is performed in the opposing area of the roll electrode 20a and the roll electrode 20b.

The mixed gas supplying device 24b supplies a raw material gas to form a layer of an inorganic compound such as an inorganic oxide, an inorganic nitride or inorganic carbide; nitrogen gas or a rare gas such as argon gas or helium gas; and a gas to inhibit decomposition of the raw material gas to the discharge space 23.

A first power source 25 outputs a voltage of frequency $\omega1$ and second power source 26 outputs a voltage of frequency $\omega2$ and these voltages generate an electric field V formed by overlapping frequencies $\omega1$ and $\omega2$ in the discharge space 23. Then, the mixed gas is made (or excited) to a plasma state. The mixed gas which has been made (or excited) to a plasma state is exposed to the surfaces of the substrate 175 of the first film forming device 2b1 and the substrate 175 of the second film forming device 2b2 and a layer (inorganic compound layer) corresponding to a raw material gas contained in the mixed gas which has been made (or excited) to a plasma state, is simultaneously deposited and formed on the surface of the substrate 175 of the first film forming device 2b1 and on the surface of the substrate 175 of the second film forming device 2b2.

Herein, opposed roll electrode 20a and roll electrode 20b are disposed separatedly at a prescribed distance.

Further, in another embodiment, one roll electrode of the roll electrode 20a and the roll electrode 20b is grounded and the other roll electrode is connected to a power source. In that case, the power source preferably employs a second power source to ensure formation of a dense layer, specifically when using nitrogen gas or a rare gas such as argon as a discharge gas.

In the following, there will be detailed the thin-layer forming area of an atmospheric plasma CVD apparatus to form an inorganic compound layer on the substrate.

Figure 5:
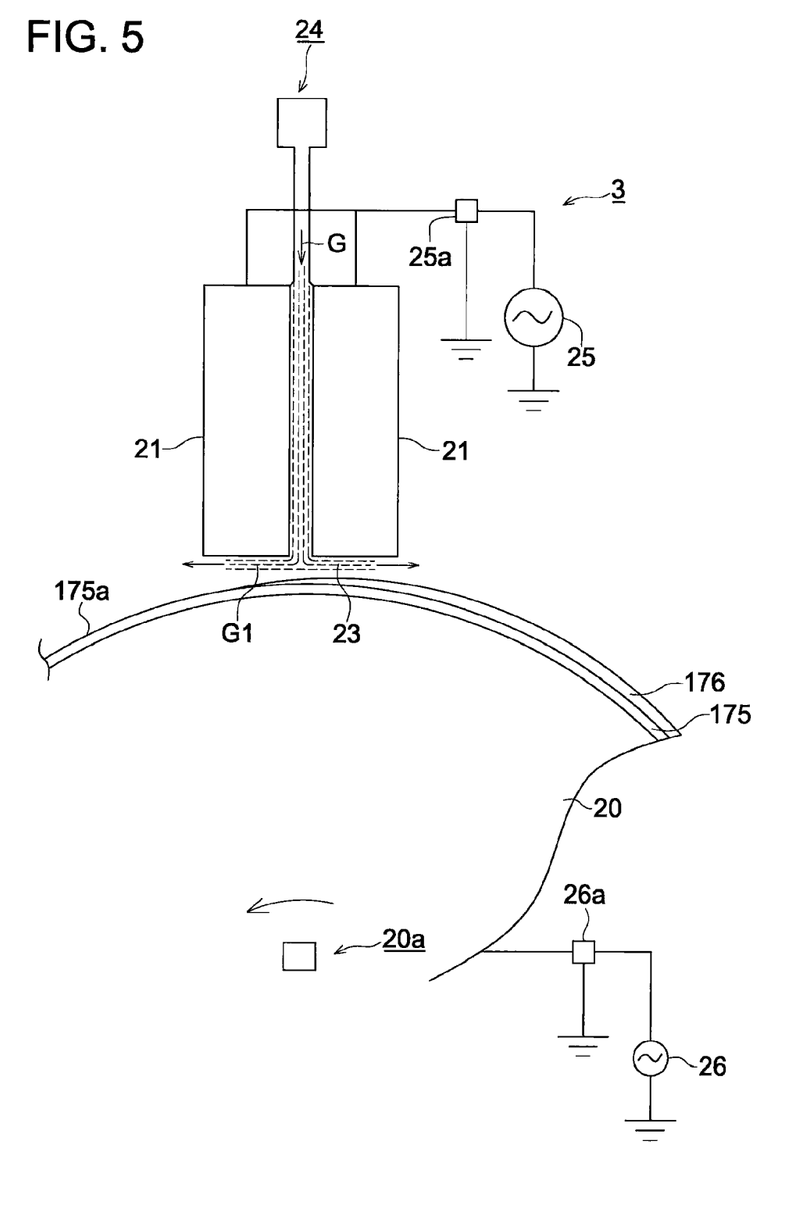
FIG. 5 is a view showing a frame format of an example of constitution of a thin-layer forming area in an atmospheric plasma CVD apparatus.

FIG. 5 illustrates a view showing an example of the constitution of a thin-layer forming region in an atmospheric plasma CVD apparatus.

FIG. 5 is an abstraction of the thin-layer forming region of the broken line portion in the atmospheric plasma CVD apparatus shown in FIG. 3.

There will be described an example of a suitable atmospheric plasma CVD apparatus used for formation of the first inorganic compound layer 176 with reference to FIG. 5.

An atmospheric plasma CVD apparatus 3 is a production apparatus of an intermediate transfer member, which is provided with at least one pair of rollers which detachably entrains the substrate and rotatably drives it and at least one pair of electrodes performing plasma discharge, wherein one electrode of the pair of electrodes is a roller of the pair of rollers and the other electrode is a fixed electrode opposed to the foregoing roller via the substrate, and the substrate is exposed to plasma generated in the opposing area of the roller and the fixed electrode to deposit and form an inorganic compound layer. When using nitrogen as a discharge gas, for example, application of a high voltage to one power source and application of a high-frequency to the other power source stably initiate discharge and continue the discharge, rendering it feasible to suitably employ the apparatus.

As described above, the atmospheric plasma CVD apparatus 3 is provided with a mixed gas supplying device 24, a fixed electrode 21, a first power source 25, a first filter 25a, a roll electrode 20, a driving means 20a to rotatably drive the roll electrode in the direction indicated by the arrow, a second power source 26 and a second filter 26a, and plasma discharging is performed in a discharge space 23 to excite a gas mixture G composed of a raw material gas containing an organic material and a discharge gas, while the substrate surface 175a is exposed to thus excited gas mixture G1 to deposit and form a carbon-containing inorganic compound layer on the substrate surface.

A first high-frequency voltage of frequency $\omega1$ is applied to the fixed electrode 21 from the first power source 25 and a second high-frequency voltage of frequency $\omega2$ is applied to the roll electrode 20 from the second power source 26, whereby an electric field overlapping the frequency $\omega1$ at an electric field intensity $V_1$ and the frequency $\omega2$ at an electric field intensity $V_2$ is generated between the fixed electrode 21 and the roll electrode 20, a current $I_1$ is sent through the fixed electrode 21 and a current $I_2$ is sent through the roll electrode 20, generating plasma between electrodes.

Herein, the relationship of the frequency ω1 and the frequency ω2, and the relationship of the electric field intensity $V_1$, the electric field intensity $V_2$ and an electric field strength IV satisfy:

$$V_1 \geq IV > V_2 \text{ or } V_1 > IV \geq V_2 \text{ at } \omega 1 < \omega 2$$

and an output density of the second high-frequency electric field becomes not less than 1 W/cm².

The electric field intensity initiating discharge of nitrogen gas is 3.7 kV/mm, so that the electric field $V_1$ applied from the first power source 25 is preferably 3.7 kV/mm or more, and the electric field $V_2$ applied from the second high-frequency power source 60 is preferably 3.7 kV/mm or less.

Examples of the first power source 25 (high-frequency power source), which is applicable to the first atmospheric plasma CVD apparatus 3 include the commercially available ones described below, any one of which is usable.

| Applied Power Symbol | Maker | Frequency | Product Name |
|---|---|---|---|
| A1 | Shinko Denki | 3 kHz | SPG3-4500 |
| A2 | Shinko Denki | 5 kHz | SPG5-4500 |
| A3 | Kasuga Denki | 15 kHz | AGI-023 |
| A4 | Shinko Denki | 50 kHz | SPG50-4500 |
| A5 | Haiden Laboratory | 100 KHz* | PHF-6k |
| A6 | Pearl Ind. | 200 kHz | CF-2000-200k |
| A7 | Pearl Ind. | 400 kHz | CF-2000-400k |

Examples of the second power source 26 (high-frequency power source) include the following, any one of which is usable.

| Applied Power Symbol | Maker | Frequency | Product Name |
|---|---|---|---|
| B1 | Pearl Ind. | 800 kHz | CF-2000-800k |
| B2 | Pearl Ind. | 2 MkHz | CF-2000-2M |
| B3 | Pearl Ind. | 13.56 MkHz | CF-5000-13M |
| B4 | Pearl Ind. | 27 MkHz | CF-2000-27M |
| B5 | Pearl Ind. | 150 MkHz | CF-2000-150M |
| B6 | Pearl Ind. | 20-99.9 MkHz | RP-2000-20/100M |

Of the foregoing power sources, the asterisk mark (*) indicates Heiden Res. Lab. Impulse high-frequency power source (100 kHz in the continuous mode). Otherwise, they are a high-frequency power source applicable only by a continuous sine wave.

In the present invention, electric power supplied between opposed electrodes from the first and second power sources is supplied at a power (output density) of 1 W/cm² and the discharge gas is excited to a plasma state, thereby forming a thin-layer. The upper limit of power supplied to the fixed electrode 21 preferably is 50 W/cm², while the lower limit preferably is 1.2 W/cm². A discharge area (cm²) refers to an area of the region causing discharge in the electrode.

Supplying power (output density) at 1 W/cm² or more (preferably, 2 W/cm² or more) to the roll electrode 20 results in enhanced output density, while maintaining uniformity of the electric high-frequency field. Thereby, a further uniform, high-density plasma can be formed, achieving compatibility of enhanced film-forming speed and enhanced film quality. The upper limit of power supplied to the roll electrode 20 is preferably 50 W/cm².

Herein, the waveform of a high-frequency electric field is not specifically limited and includes, for example, a continuous oscillation mode of a continuous sine wave form, called continuous oscillation mode and an intermittent oscillation mode intermittently performed on-off, called intermittent oscillation mode. Either one can be adopted but a high-frequency wave supplied to at least roll electrode 20 is preferably a continuous sine wave, whereby formation of a dense and high quality thin-layer is achieved.

Further, the first filter 25a is provided between the fixed electrode 21 and the first power source 25, thereby causing an electric current to flow from the first power source 25 to the fixed electrode 21 to be easily passed, and an electric current from the second power source 26 is grounded, thereby making it difficult to cause a current from the second power source 26 to the first power source 25 to pass; the second filter 26a is provided between the roll electrode 20 and the second power source 26, thereby causing an electric current from the second power source 26 to the roll electrode 20 to easily pass, and an electric current from the first power source 21 is grounded, thereby making it difficult to cause current from the first power source 25 to the second power source 26 to pass.

It is preferred to employ an electrode capable of maintaining a uniform and stable discharge state upon application of a strong electric field to the electrode. The electrode surface of at least one of the fixed electrode 21 and the roll electrode 20 is covered with a dielectric described below to be resistant to a strong electric field.

In the foregoing relationship of an electrode and a power source, the fixed electrode 21 and the roll electrode 20 may be connected to the second power source 26 and the first power source 25, respectively.

In another form, one of the fixed electrode 21 and the roll electrode 20 is grounded and the other one may be connected to a power source. In that case, the power source preferably employs the second power source, thereby forming a denser thin-layer, specifically when using a rare gas such as argon as a discharge gas.

Figure 6A:
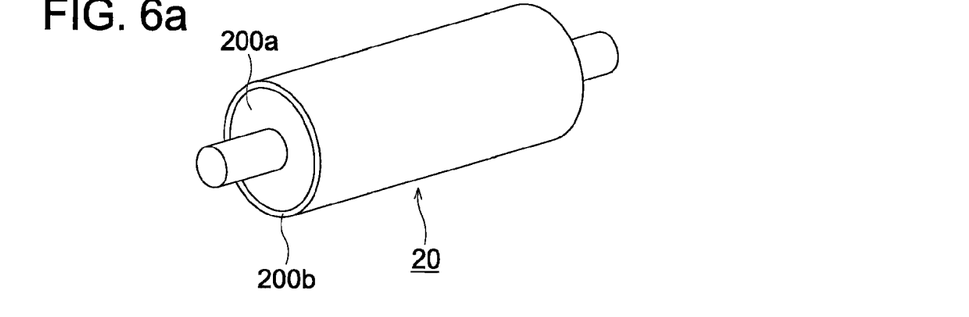
FIGS. 6a and 6b are perspective views illustrating an example of a roll electrode.
Figure 6B:
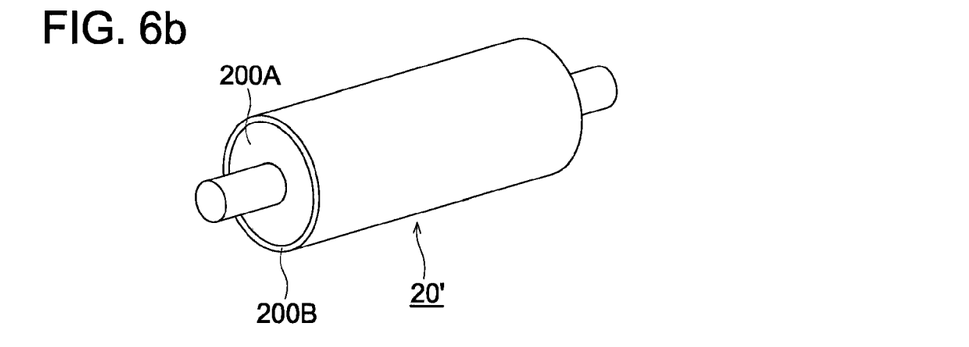

FIGS. 6a and 6b are perspective views showing an example of a roll electrode.

There will be described the constitution of the roll electrode 20. As shown in FIG. 6a, a roll electrode 20 is comprised of an electrically conductive base material 200a, such as a metal (hereinafter, denoted also as a electrode base material), which is thermally sprayed with a ceramic and then covered with a ceramic-covered dielectric 200b having been subjected to a hole-sealing treatment (hereinafter, also denoted simply as a dielectric). Preferred ceramic materials for use in such thermal-spraying include, for example, alumina and silicon nitride and of these, alumina is more preferred in terms of easier processability.

As shown in FIG. 6b, a roll electrode 20' may be comprised of an electrically conductive base material 200A such as a metal, which is covered with a lining-treated dielectric 200B having been provided with an inorganic material lining. There are preferably used lining materials such as a silicate glass, a borate glass, a phosphate glass, a germanate glass, a tellurite glass, an aluminate glass and a vanadate glass. Of these, a borate glass is more preferred in terms of easy processability.

Examples of the conductive base material 200a or 200A include silver, platinum, stainless steel, aluminum and iron, and of these, stainless steel is preferred in terms of easier processability.

In one of the embodiments of the invention, a base material used for a roll electrode 200a or 200A employs a stainless steel jacket roll base material incorporating a cooling means (not shown in the drawing).

Figure 7A:
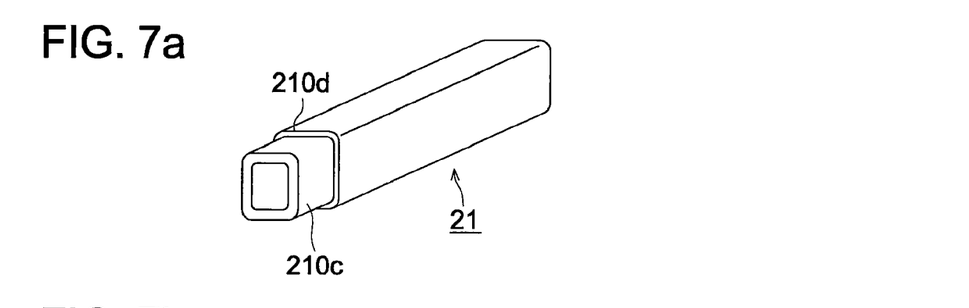
FIGS. 7a and 7b are perspective views illustrating an example of a fixed electrode.
Figure 7B:
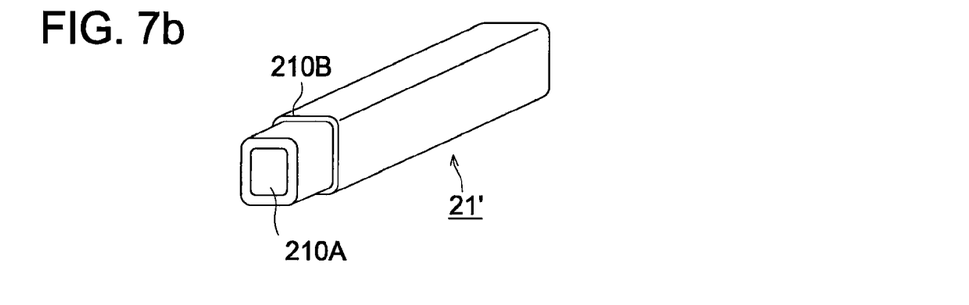

FIGS. 7a and 7b are perspective views showing an example of a fixed electrode.

In FIG. 7a, a fixed electrode 21 of a square pillar or square barrel pillar is comprised of an electrically conductive base material 210c, such as a metal, which is thermally sprayed with a ceramic and then covered with a ceramic-covered dielectric 210d having been subjected to a hole sealing treatment, similarly to the roll electrode 20. Further, as shown in FIG. 7b, a fixed electrode 21' of a square pillar or square barrel pillar may be comprised of an electrically conductive base material 210A such as a metal, which is covered with a lining-treated dielectric 210B having been provided with an inorganic material lining.

In the following, there will be described an example of a film-forming step in the process of producing an intermediate member, comprising depositing an inorganic compound on a substrate 175 to form an inorganic compound layer, with reference to FIGS. 3 and 5.

In FIGS. 3 and 5, after the substrate 175 is entrained about the roll electrode 20 and the driving roller 201, a prescribed tension is applied to the substrate 175 by the action of the tension-energizing means 202 and subsequently, the roll electrode 20 is rotatably driven at a prescribed rotation speed.

The mixed gas G which is formed from the mixed gas supplying device 24b is released into the discharge space 23.

A voltage of frequency ω1 is outputted from a first power source 25 and applied to a fixed electrode 21, and then, a voltage of frequency ω2 is outputted from a second power source 26 and applied to a roll electrode 20 and frequencies ω1 and ω2 are superimposed to the discharge space by these voltages to generate an electric space.

The mixed gas which has been released to the discharge space 23 is excited to a plasma state. Then, the substrate surface is exposed to the mixed gas G, being in a plasma state, whereby a raw material gas contained in the mixed gas G forms at least one layer selected from an inorganic oxide layer, an inorganic nitride layer and an inorganic carbide layer, that is, a first inorganic compound layer 176 on the substrate 175.

In a similar manner as above, a second inorganic compound layer 177 can be formed in the thus formed first inorganic compound layer.

The discharge gas refers to a gas which has been excited to a plasma state by the foregoing conditions and including, for example, nitrogen, argon, helium, neon, krypton, xenon and mixtures thereof.

A raw material gas is one containing a component capable of forming a thin-layer and examples thereof include an organic metal compound and an organic compound.

Example of a silicone compound include silane, tetramethoxysilane, tetraethoxysilane (TEOS), tetra-n-propoxysilane, tetraisopropoxysilane, tetra-n-butoxysilane, tetra-t-butoxysilane, dimethyldimethoxysilane, dimethyldiethoxysilane, diethyldimethoxysilane, diphenyldimethoxysilane, methyltrimethoxysilane, ethyltrimethoxysilane, phenyltrimethoxysilane, (3,3,3-trifluoropropyl)trimethoxysilane, hexamethyldisilane, bis(dimethylamino)dimethylsilane, bis(dimethylamino)methylvinylsilane, bis(ethylamino)dimethylsilane, N,O-bis(trimethylsilyl)acetoamide, bis(trimethylsilyl)carbodiimide, diethylaminotrimethylsilane, dimethylaminodimethylsilane, hexamethyldisilane, hexamethylcyclotrisilazane, nonamethyltrosilazane, octamethylcyclotetrasilazane, tetrakisdimethylaminosilane, tetraisocyanatosilane, tetramethyldisilane, tris(dimethylamino)silane, triethoxyfluorosilane, allyldimethylsilane, allylytimethylsilane, benzyltrimethylsilane, bis(trimethylslyl)acetylene, 1,4-bisbistrimethylsilyl-1,3-butadiene, di0t-butylsilane, 1,3-disilabutane, bis(trimethylsilyl)methane, cyclopentadienyltrimethylsilane, phenyldimethylsilane, phenytrimethylasilane, propargyltrimethylsilane, tetramethylsilane, trimethylsilylacetylene, 1-(trimethylsilyl)-1-propyne, tris(trimethylsilyl)methane, tris(trimethylsilyl)silane, vinyltrimethylsilane, hexamethyldisilane, octamethylcyclotetrasiloxane, tetramethylcyclotetrasiloxane, hexamethylcyclotetrasiloxane, and M silicate 51, but are not limited to these.

Titanium compounds include, for example, an organic metal compound such as tetramethylaminotitanium; a metal hydride compound such as titanium monohydride or titanium dihydride; a metal halide compound such as titanium dichloride, titanium trichloride or titanium tetrachloride; and a metal alkoxide such as tetraethoxytitanium, tetraisopropoxytitanium or tetrabutoxytitanium, but are not limited to these.

Examples of an aluminum compound include aluminum butoxide, aluminum s-butoxide, aluminum t-butoxide, aluminum diisopropoxide ethyl acetate, aluminum ethoxide, aluminum hexafluoropentanedionate, aluminum isproxide, aluminum(III) 2,4-pentanedionate and dimethylaluminum chloride, but are also not limited to these.

Examples of a zinc compound include zinc bis[bis(trimethylsilyl)amide, zinc 2,4-pentanedionate and zinc 2,2,6,6-tetramethyl-3,5-heptanedionate, but are also not limited to these.

Examples of a zirconium compound include zirconium t-butoxide, zirconium di-isopropoxide-bis(2,2,6,6-tetramethyl-3,5-hepatanedionate), zirconium ethoxide, zirconium hexafluoropentanedionate, zirconium isopropoxide, zirconium 2-methyl-2-butoxide, and zirconium trifluoropentanedionate, but are not limited to these.

These raw materials, which are capable of forming an inorganic compound layer having a carbon content described above, may be used singly or in combinations with two or more.

Formation of two inorganic compound layers, that is, a first inorganic compound layer and a second inorganic compound layer on the substrate surface according to the requirements defined in the present invention can provide an intermediate transfer member which exhibits enhanced transferability and is superior in cleaning property, durability and image quality (free from lack of line images).

In the respective constituent layers, a carbon content, as defined in the present invention can be achieved by controlling the amount of the raw material gas, the amount of a reaction gas controlling decomposition of the raw material gas, and by setting conditions of the plasma discharge treatment apparatus. For example, in the individual constituent layer, a carbon content defined in the present invention can be achieved by choosing optimum conditions such as the amount of raw material gas, the amount of a reaction gas controlling decomposition of the raw material gas, and the power source output or an applied frequency of the plasma discharge treatment apparatus. Specifically in an atmospheric plasma discharge treatment apparatus, the targeted constituent layer can be formed high-economically within a short time only by varying the partial film-forming conditions such as the reaction gas amount using an identical raw material in a continuous process of an identical apparatus.

EXAMPLES

The present invention is further described specifically with reference to examples, but the present invention is by no means limited to these.

Example 1

Preparation of Intermediate Transfer Member

Preparation of Intermediate Transfer Member 1
Preparation of Substrate:

The substrate for an intermediate transfer member was prepared in the following manner.

| | |
|---|---|
| Polyphenylene sulfide resin (E2180, produced by TORAY Co.) | 100 parts by mass |
| Conductive filler (Furnace #3030B, (produced by Mitsubishi Kagaku Co.) | 16 parts by mass |
| Graft copolymer (Modiper A4400, Produced by Nippon Yushi Co.) | 1 part by mass |
| Lubricant (calcium montanate) | 0.2 part by mass |

Raw materials described above were placed into a single-spindle extruder and meltingly kneaded to obtain a resin mixture. Subsequently, a cyclic die having a slit form discharge opening and a seamless belt form was fitted onto the top of the single-spindle extruder and the kneaded resin mixture was extruded in a seamless belt form. The thus extruded resin mixture of a seamless belt was entrained about a cooling cylinder provided at the top of the discharge opening to be cooled and solidified, whereby a 120 μm thick seamless-cylindrical substrate material used for an intermediate transfer member was prepared.

Formation of Inorganic Compound Layer:

On the thus prepared substrate and using the atmospheric plasma treatment apparatus shown in FIG. 5, a first layer (first inorganic compound layer) and a second layer (second inorganic compound layer) were sequentially formed in this order from the substrate to prepare an intermediate transfer member 1.

Formation of First Layer (First Inorganic Compound Layer):

Using the atmospheric plasma treatment apparatus shown in FIG. 5, an 85 nm thick first inorganic compound layer was formed on the substrate according to the following layer forming conditions. In the atmospheric plasma treatment apparatus, there was used a dielectric covering the individual electrode employed alumina which covered the single side at a 1 mm thickness by a ceramic thermal spray processing. A dielectric-covered metal base material of the individual roll electrode was specifically for use in a stainless steel jacket having heating or cooling function via water cycling and a plasma treatment was performed, while maintaining the roll electrode surface at a constant temperature by circulating 50° C. water during plasma discharge. The spacing between the electrodes was set to 0.5 mm and the individual layer thickness was controlled by controlling treatment time.

The carbon content of the first layer formed by the following layer-forming condition was 5.0% by number of atoms (or 5 at. %), which was determined by the afore-described XPS method using an X-ray photoelectron spectrometer (ES-CALAB 200R, produced by VG Scientific Co.). The average layer density was 1.89 g/cm$^3$, which was determined by the afore-described X-ray reflectance method (MXP 21, produced by MAC Science Co.).

Layer Forming Condition of First Layer:

Discharge gas: nitrogen gas (3.5 slm per 1 cm treatment width),
Reaction gas: 1.0 vol. % oxygen gas of total gas,
Raw material gas: 0.05 vol. % tetraethoxysilane (TEOS) of total gas,
Low-frequency power source: Impulse high-frequency power source, produced by HAIDEN LAVOLATORY (PHF-6k) (100 k Hz) 10 W/cm$^2$,
High-frequency power source: Broadband high-frequency power source, produced by PEARL KOGYO Co., Ltd. (RP-2000-20/100M) (60.0 MHz) 10 W/cm$^2$.

Formation of Second Layer:

The second layer having a 175 nm thickness, a carbon content of less than 0.1% by number of atoms (or 0.1 at. %) and an average layer density of 2.21 g/cm$^3$ was formed on the foregoing first layer (adhesive layer) by using an atmospheric plasma treatment apparatus similarly to the first layer, except that the oxygen gas concentration of the reaction gas was varied to 21 vol. % of total gas.

Preparation of Intermediate Transfer Members 2-8

Intermediate transfer members 2-8 were each prepared similarly to the intermediate transfer member 1, except that the thicknesses of the first layer and the second layer were varied, as shown in Table 1.

Preparation of Intermediate Transfer Member 9

Intermediate transfer member 9 was prepared similarly to the intermediate transfer member 1, except that the oxygen gas concentration in the formation of the first layer (first inorganic compound layer) was varied to 12 vol. % of total gas to form the first layer having a thickness of 85 nm, a carbon content of 0.4% by number of atoms and an average layer density of 2.09 g/cm$^3$.

Preparation of Intermediate Transfer Member 10

Intermediate transfer member 10 was prepared similarly to the intermediate transfer member 1, except that the oxygen gas concentration in the formation of the first layer (first inorganic compound layer) was varied to 8.6 vol. % of total gas to form the first layer having a thickness of 85 nm, a carbon content of 0.7% by number of atoms and an average layer density of 2.06 g/cm$^3$.

Preparation of Intermediate Transfer Member 11

Intermediate transfer member 11 was prepared similarly to the intermediate transfer member 1, except that the oxygen gas concentration in the formation of the first layer (first inorganic compound layer) was varied to 2.3 vol. % of total gas to form the first layer having a thickness of 85 nm, a carbon content of 3.0% by number of atoms and an average layer density of 1.94 g/cm$^3$.

Preparation of Intermediate Transfer Member 12

Intermediate transfer member 12 was prepared similarly to the intermediate transfer member 1, except that the oxygen gas concentration in the formation of the first layer (first inorganic compound layer) was varied to 0.7 vol. % of total gas to form the first layer having a thickness of 85 nm, a carbon content of 7.5% by number of atoms and an average layer density of 1.84 g/cm$^3$.

Preparation of Intermediate Transfer Member 13

Intermediate transfer member 13 was prepared similarly to the intermediate transfer member 1, except that the reaction gas in the formation of the first layer (first inorganic compound layer) was varied to hydrogen gas at 2.0 vol. % of total gas to form the first layer having a thickness of 85 nm, a carbon content of 9.5% by number of atoms and an average layer density of 1.81 g/cm$^3$.

Preparation of Intermediate Transfer Member 14

Intermediate transfer member 14 was prepared similarly to the intermediate transfer member 1, except that the reaction gas in the formation of the first layer (first inorganic compound layer) was varied to hydrogen gas at 1.0 vol. % of total gas and the power source of the high-frequency side was varied 3 W/cm$^2$ to form the first layer having a thickness of 85 nm, a carbon content of 11.0% by number of atoms and an average layer density of 1.67 g/cm$^3$.

Preparation of Intermediate Transfer Member 15

Intermediate transfer member 15 was prepared similarly to the intermediate transfer member 1, except that the oxygen gas concentration in the formation of the second layer (second inorganic compound layer) was varied to 18 vol. % of total gas to form the first layer having a thickness of 175 nm, a carbon content of 0.2% by number of atoms and an average layer density of 2.13 g/cm$^3$.

Evaluation of Adhesion to Substrate:

The intermediate transfer members were each allowed to stand for 24 hrs. under an environment of 23° C. and 50% RH. The surface of the individual intermediate transfer member was cut by a single-edged razor at an angle of 90° to the surface in 11×11 lines at intervals of 1 mm to form 10×10 squares of 1 mm. Subsequently, adhesive tape, produced by Nichiban Co. was securely adhered to cut portions and then, one end of the tape was strongly peeled. The proportion of the peeled area of a thin-film formed by 100 squares was visually

TABLE 1

| Intermediate Transfer Member No. | 1st Layer: 1st Inorganic Compound Layer | | | 2nd Layer: 2nd Inorganic Compound Layer (surface layer) | | | Thickness Ratio of 1st Layer:2nd Layer | Remark |
|---|---|---|---|---|---|---|---|---|
| | Thickness (nm) | Carbon Content (at. %) | Average Layer Density (g/cm$^3$) | Thickness (nm) | Carbon Content (at. %) | Average Layer Density (g/cm$^3$) | | |
| 1  | 85  | 5.0  | 1.89 | 175 | less than 0.1 (*) | 2.21 | 1:2.1 | Inv.  |
| 2  | 144 | 5.0  | 1.89 | 116 | less than 0.1 (*) | 2.21 | 1:0.8 | Comp. |
| 3  | 130 | 5.0  | 1.89 | 130 | less than 0.1 (*) | 2.21 | 1:1.0 | Inv.  |
| 4  | 104 | 5.0  | 1.89 | 156 | less than 0.1 (*) | 2.21 | 1:1.5 | Inv.  |
| 5  | 74  | 5.0  | 1.89 | 186 | less than 0.1 (*) | 2.21 | 1:2.5 | Inv.  |
| 6  | 58  | 5.0  | 1.89 | 202 | less than 0.1 (*) | 2.21 | 1:3.5 | Inv.  |
| 7  | 45  | 5.0  | 1.89 | 215 | less than 0.1 (*) | 2.21 | 1:4.8 | Inv.  |
| 8  | 40  | 5.0  | 1.89 | 220 | less than 0.1 (*) | 2.21 | 1:5.5 | Comp. |
| 9  | 85  | 0.4  | 2.09 | 175 | less than 0.1 (*) | 2.21 | 1:2.1 | Comp. |
| 10 | 85  | 0.7  | 2.06 | 175 | less than 0.1 (*) | 2.21 | 1:2.1 | Inv.  |
| 11 | 85  | 3.0  | 1.94 | 175 | less than 0.1 (*) | 2.21 | 1:2.1 | Inv.  |
| 12 | 85  | 7.5  | 1.84 | 175 | less than 0.1 (*) | 2.21 | 1:2.1 | Inv.  |
| 13 | 85  | 9.5  | 1.81 | 175 | less than 0.1 (*) | 2.21 | 1:2.1 | Inv.  |
| 14 | 85  | 11.0 | 1.67 | 175 | less than 0.1 (*) | 2.21 | 1:2.1 | Comp. |
| 15 | 85  | 5.0  | 1.89 | 175 | 0.20              | 2.13 | 1:2.1 | Comp. |

(*): Less than 0.1 at. % (including 0 at. %), indicating not more than the lower detection limit of a detector The thus prepared intermediate transfer members were each evaluated with respect to characteristics according to the following procedure.

Evaluation of Secondary Transferability of Toner:

Secondary transferability of a toner was evaluated in terms of a toner transfer ratio, which represents a ratio of the mass of a toner image transferred onto recording paper sheets to the mass of a toner image formed on each of the intermediate transfer members.

There was used a printer (magicolor 5440DL, produced by Konica Minolta Business Technology Inc.), in which an intermediate transfer belt was removed and each of the prepared intermediate transfer belt was provided.

A polymerization toner having an average particle size of 6.5 μm was set to this printer and printing was conducted on Konica Minolta CF Paper (produced by Konica Minolta Business Technology Inc.) at a maximum toner density of the respective yellow, magenta, cyan and black colors. An amount of a toner transferred onto a printed paper sheet and the amount of a residual toner on the employed belt were each measured based on optical (reflection) density. The measurement results were converted to a toner amount in accordance with a relational expression which was previously determined, a toner transfer ratio (%) defined below was then determined and evaluation was made with respect to secondary transferability, based on the following criteria.

Transfer ratio (%)={(amount of toner transferred to printing paper)/[(amount of toner transferred to printing paper)+(amount of toner remained on belt)]}×100

A: Transfer ratio of not less than 98%,
B: Transfer ratio of not less than 95% and less than 98%,
C: Transfer ratio of not less than 90% and less than 95%,
D: Transfer ratio of less than 90%.

observed and evaluated with respect to adhesion to the substrate, based on the following criteria.

A: No peeling was observed,
B: A peeled area of not less than 1% and less than 5%,
C: A peeled area of not less than 5% and less than 10%,
D: A peeled area of not less than 10%.

Evaluation of Durability 1 (Continuous Output)

Using the same printer as used in the foregoing evaluation of toner secondary transferability, printing of 200,000 sheets was run on Konica Minolta CF Paper (A4) at a test pattern with a 5% image ratio for the respective colors under an environment of 23° C. and 50% RH. Prints of the 1st and 200,000th sheets were visually observed with respect to presence/absence of variation in image quality and durability (1) was evaluated based on the following criteria.

A: No change in the printed 1st and 200,000th sheets was observed and nor any trouble noted in the image,
B: No trouble of image was observed in the 1st printed sheet, and a slight change was observed but the quality was acceptable in practice,
C: No trouble of image was observed in the 1st printed sheet, and a change was observed but the quality was acceptable in practice,
D: No trouble of image was observed in the 1st printed sheet, but changes were apparently observed on the printed 200,000 sheet and quality was unacceptable in practice.

Evaluation of Durability 2 (High Temperature and High Humidity Resistance):

The intermediate transfer members were each allowed to stand for 6 months under an environment of 50° C. and 90% RH to be subjected to accelerated aging. Using the same printer as in the foregoing evaluation of toner secondary transferability in which the intermediate transfer belt was removed and each of the aged intermediate transfer member was provided, printing was conducted on Konica Minolta CF Paper (A4) at a test pattern with a 5% image ratio for the respective colors under an environment of 35° C. and 85% RH, and the outputted print was visually observed with respect to the presence/absence of lack of line images and evaluation of durability (2) was based on the following criteria.

A: No lack of line images was observed,

B: Extremely slight lack of line images was observed but image quality was superior, C: Slight lack of line images was partially observed but quality was still considered to be acceptable in practice, D: Lack of line images was apparently observed and quality was unacceptable in practice.

Results are shown in Table 2.

Evaluation of Durability 3 (High Temperature and Low Humidity Resistance):

The intermediate transfer members were each allowed to stand for 6 months under an environment of 50° C. and 15% RH to be subjected to accelerated aging. Using the printer used in the foregoing evaluation of toner secondary transferability in which the intermediate transfer belt was removed and each of the aged intermediate transfer members was provided, printing was conducted on Konica Minolta CF Paper (A4) at a test pattern with a 5% image ratio for the respective colors under an environment of 35° C. and 85% RH, and the outputted prints were visually inspected with respect to the presence/absence of lack of line images and evaluation of durability (3) was made based on the following criteria.

A: No lack of line images was observed,

B: Extremely slight lack of line images was observed but quality was superior,

C: Slight lack of line images was partially observed but quality was still acceptable in practice, D: Lack of line images was apparently observed and quality was unacceptable in practice.

The thus obtained results are shown in Table 2.

As is apparent from the results shown in Table 2, it was proved that printers using an intermediate transfer member of constitution defined in the present invention were superior in secondary transferability, durability on continuous output and resistance to lack of line images after being aged under high temperature and high humidity.

Example 2

Similarly to the preparation of the respective intermediate transfer members of Example 1, intermediate transfer members were prepared, provided that, as a constituent material of the first and second inorganic compound layers, a silicon oxide layer was replaced by each of a titanium oxide layer, an aluminum oxide layer, a zirconium oxide layer and a zinc oxide layer. The thus prepared intermediate transfer members were evaluated similarly to Example 1. As a result, it was proved that intermediate transfer members of the invention achieved superior results to the comparison examples, but their targeted effects were slightly lower, as compared to the intermediate transfer member (silicon oxide layer) described in Example 1.

What is claimed is:

1. An intermediate transfer member comprising a substrate having thereon from the substrate side a first inorganic compound layer and a second inorganic compound layer, wherein a layer thickness ratio of the second inorganic compound layer to the first inorganic compound layer is not less than 1.0 and not more than 5.0, a carbon content of the first inorganic compound layer is not less than 0.5% by number of atoms and not more than 10% by number of atoms, and a carbon content of the second inorganic compound layer is less than 0.1% by number of atoms.

2. The intermediate transfer member as claimed in claim 1, wherein the first inorganic compound layer exhibits a thickness of not less than 20 nm and not more than 200 nm.

3. The intermediate transfer member as claimed in claim 1, wherein the second inorganic compound layer exhibits a thickness of not less than 100 nm and not more than 500 nm.

4. The intermediate transfer member as claimed in claim 1, wherein the layer thickness ratio of the second inorganic

TABLE 2

| Intermediate Transfer Member No. | Secondary Transferability | Adhesion to Substrate | Evaluation Result 1: Continuous Output | Durability 2: High Temperature/ High Humidity | 3: High Temperature/ Low Humidity | Remark |
|---|---|---|---|---|---|---|
| 1 | A | A | A | A | A | Inv. |
| 2 | B | A | D | D | D | Comp. |
| 3 | B | A | B | B | C | Inv. |
| 4 | A | A | A | A | A | Inv. |
| 5 | A | A | A | A | A | Inv. |
| 6 | A | B | A | A | A | Inv. |
| 7 | A | C | A | A | A | Inv. |
| 8 | B | D | B | C | D | Comp. |
| 9 | B | D | B | C | D | Comp. |
| 10 | B | C | B | B | B | Inv. |
| 11 | A | B | A | A | A | Inv. |
| 12 | A | A | A | A | A | Inv. |
| 13 | C | A | B | B | B | Inv. |
| 14 | D | A | D | D | D | Comp. |
| 15 | D | B | C | D | D | Comp. | compound layer to the first inorganic compound layer is not less than 1.5 and not more than 2.5.

5. The intermediate transfer member as claimed in claim 1, wherein the first inorganic compound layer or the second inorganic compound layer comprises an inorganic compound containing at least one atom selected from the group consisting of Si, Ti, Al, Zr and Zn.

6. The intermediate transfer member as claimed in claim 1, wherein the first inorganic compound layer and the second inorganic compound layer comprise an inorganic compound containing at least one atom selected from the group consisting of Si, Ti, Al, Zr and Zn.

7. The intermediate transfer member as claimed in claim 1, wherein the first inorganic compound layer and the second inorganic compound layer are each comprised of an inorganic compound of a silicon oxide, and the first inorganic compound layer exhibits an average layer density of not less than 1.80 $g/cm^3$ and less than 2.15 $g/cm^3$, and the second inorganic compound layer exhibits an average layer density of not less than 2.10 $g/cm^3$ and less than 2.30 $g/cm^3$.

8. The intermediate transfer member, as claimed in claim 1, wherein the first inorganic compound layer or the second inorganic compound layer is formed by an atmospheric pressure plasma CVD method, which comprises supplying a gas containing a layer forming gas to an electric discharge space formed between opposed electrodes under atmospheric pressure or a pressure near atmospheric pressure, applying a high-frequency electric field to the electric discharge space to excite the gas and exposing the substrate to the excited gas to form an inorganic compound layer on the substrate.

9. The intermediate transfer member as claimed in claim 1, wherein the first inorganic compound layer and the second inorganic compound layer are formed by an atmospheric pressure plasma CVD method, which comprises supplying a gas containing a layer forming gas to an electric discharge space formed between opposed electrodes under atmospheric pressure or a pressure near atmospheric pressure, applying a high-frequency electric field to the electric discharge space to excite the gas and exposing the substrate to the excited gas to form an inorganic compound layer on the substrate.

10. An image forming apparatus of developing an image carrier surface to form a toner image, transferring the toner image to an intermediate transfer member and further transferring the toner image to a transfer paper, wherein the intermediate transfer member is one as claimed in claim 1.

* * * * *